United States Patent
Chen et al.

(10) Patent No.: US 12,069,900 B2
(45) Date of Patent: Aug. 20, 2024

(54) MANUFACTURING METHOD OF DISPLAY PANEL AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Lixuan Chen, Shenzhen (CN); Jinyang Zhao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 526 days.

(21) Appl. No.: 17/419,727

(22) PCT Filed: May 31, 2021

(86) PCT No.: PCT/CN2021/097437
§ 371 (c)(1),
(2) Date: Jun. 30, 2021

(87) PCT Pub. No.: WO2022/241832
PCT Pub. Date: Nov. 24, 2022

(65) Prior Publication Data
US 2023/0139616 A1   May 4, 2023

(30) Foreign Application Priority Data
May 20, 2021   (CN) .......................... 202110553613.8

(51) Int. Cl.
*H10K 59/122*   (2023.01)
*H10K 59/12*   (2023.01)
(Continued)

(52) U.S. Cl.
CPC ....... *H10K 59/122* (2023.02); *H10K 59/1201* (2023.02); *H10K 59/123* (2023.02); *H10K 59/131* (2023.02); *H10K 71/135* (2023.02)

(58) Field of Classification Search
CPC ............. H10K 59/122; H10K 59/1201; H10K 59/123; H10K 59/131; H10K 71/135; H10K 71/00
See application file for complete search history.

(56) References Cited

U.S. PATENT DOCUMENTS

2002/0158835 A1   10/2002   Kobayashi et al.
2012/0138936 A1*  6/2012   Lee ..................... H10K 59/121
                                                            438/34
(Continued)

FOREIGN PATENT DOCUMENTS

CN       103261088 A    8/2013
CN       106972115 A    7/2017
(Continued)

*Primary Examiner* — Mohammad M Choudhry
(74) *Attorney, Agent, or Firm* — The Roy Gross Law Firm, LLC; Roy Gross

(57) ABSTRACT

A manufacturing method of a display panel and the display panel are disclosed. The manufacturing method of the display panel generates electric fields between pixel electrode layers or between the pixel electrode layers and electrode layers. The electric fields have a horizontal component and a vertical component. The vertical component of the electric fields provides a force of depositing on the pixel electrode layers for charged groups in a material of light-emitting functional layers. Therefore, the method can prompt an ink of a light-emitting functional material to be deposited on the pixel electrode layers.

18 Claims, 6 Drawing Sheets

(51) Int. Cl.
*H10K 59/123* (2023.01)
*H10K 59/131* (2023.01)
*H10K 71/13* (2023.01)

(56) References Cited

U.S. PATENT DOCUMENTS

| | | | | |
|---|---|---|---|---|
| 2012/0280958 A1* | 11/2012 | Lee | ............... | G02F 1/167 |
| | | | | 345/107 |
| 2017/0358270 A1* | 12/2017 | Hsu | ............... | G09G 3/3696 |
| 2018/0159038 A1 | 6/2018 | Leng | | |
| 2019/0006428 A1 | 1/2019 | Qi et al. | | |
| 2019/0198591 A1* | 6/2019 | Dai | ............... | H10K 71/00 |
| 2020/0357875 A1* | 11/2020 | Wang | ............... | H10K 59/131 |

FOREIGN PATENT DOCUMENTS

| | | | |
|---|---|---|---|
| CN | 107331788 A | 11/2017 | |
| CN | 107579099 A | 1/2018 | |
| CN | 107665958 A | 2/2018 | |
| CN | 108428720 A | 8/2018 | |
| CN | 110133920 A | 8/2019 | |
| CN | 111384142 A | 7/2020 | |
| JP | 2007042430 A | 2/2007 | |
| WO | 2018176744 A1 | 10/2018 | |
| WO | WO-2019153938 A1 * | 8/2019 | ........... G02F 1/1333 |

* cited by examiner

MANUFACTURING METHOD OF DISPLAY PANEL AND DISPLAY PANEL

CROSS REFERENCE TO RELATED APPLICATION

This application is a National Phase of PCT Patent Application No. PCT/CN2021/097437 having International filing date of May 31, 2021, which claims the benefit of priority of Chinese Patent Application No. 202110553613.8, filed May 20, 2021, the contents of which are all incorporated herein by reference in their entirety.

FIELD OF INVENTION

The present disclosure relates to the field of display technologies, and more particularly, to a manufacturing method of a display panel and the display panel.

BACKGROUND OF INVENTION

Organic light-emitting diode (OLED) displays manufactured by ink-jet printing technology have achieved small-scale commercialization in the field of medium-sized OLEDs. However, there are fundamental problems with ink-jet printing. First, pixel definition layers are required to have lyophobicity due to capillary phenomenon of inks, thereby preventing a thicker film thickness at pixel edges caused by edge climbing phenomenon of the inks. Second, the inks are required to have a high boiling point to prevent solutions on pixels or nozzles from volatilizing and causing uneven deposition or clogging the nozzles during printing.

In research and practice of current technology, inventors of this application found that in a process of manufacturing actual equipment and printing, it is difficult to control an intensity of vertical electric fields generated between electrodes on ink-jet printing equipment brackets and substrates. In addition, it is difficult to control drop points when print heads eject the inks, so it is difficult to achieve a better printing effect.

Technical problem: an embodiment of the present disclosure provides a manufacturing method of a display panel and the display panel to realize film formation assisted by electric fields, thereby improving an ink-jet printing effect.

SUMMARY OF INVENTION

An embodiment of the present disclosure provides a manufacturing method of a display panel. The method includes following steps:
providing a substrate;
disposing a plurality of pixel electrode layers and a plurality of electrode layers on the substrate, wherein, the pixel electrode layers and the electrode layers are insulated from each other;
disposing a pixel definition layer on one side of the pixel electrode layers away from the substrate;
forming a plurality of openings corresponding to the pixel electrode layers on the pixel definition layer, wherein, each of the openings corresponds to each of the pixel electrode layers;
forming electric fields between the pixel electrode layers or between the pixel electrode layers and the electrode layers; and
ink-jet printing a plurality of light-emitting functional layers into the openings under the electric fields.

Optionally, in some embodiments of the present disclosure, the step of forming the electric fields between the pixel electrode layers includes a following step:
electrifying the pixel electrode layers to generate voltage differences between the pixel electrode layers and then forming the electric fields between the pixel electrode layers.

Optionally, in some embodiments of the present disclosure, after the step of disposing the pixel electrode layers and the electrode layers on the substrate, the method further includes following steps:
dividing each of the pixel electrode layers into m rows and n columns of sub-pixel electrode layers, wherein, a gap is between the sub-pixel electrode layers, m and n are positive integers greater than or equal to 1, and m and n are not equal to 1 at a same time; and generating voltage differences between the sub-pixel electrode layers and then forming the electric fields between the sub-pixel electrode layers.

Optionally, in some embodiments of the present disclosure, m is two and n is two.

Optionally, in some embodiments of the present disclosure, before the step of generating the voltage differences between the sub-pixel electrode layers, the method further includes a following step:
disposing a plurality of thin film transistor devices on the substrate, wherein the thin film transistor devices are insulated from the electrode layers and electrically connected to the pixel electrode layers;
wherein each of the thin film transistor devices correspondingly controls a voltage of one row of the sub-pixel electrode layers, one column of the sub-pixel electrode layers, or one of the sub-pixel electrode layers.

Optionally, in some embodiments of the present disclosure, the gap between the sub-pixel electrode layers ranges from 1 μm to 10 μm.

Optionally, in some embodiments of the present disclosure, the step of forming the electric fields between the pixel electrode layers and the electrode layers includes a following step:
electrifying the pixel electrode layers and the electrode layers to generate voltage differences between the pixel electrode layers and the electrode layers, and then forming the electric fields between the pixel electrode layers and the electrode layers.

Optionally, in some embodiments of the present disclosure, the electrode layers are signal wiring layers or auxiliary cathode layers.

Optionally, in some embodiments of the present disclosure, the voltage differences range from 1 V to 500 V.

Optionally, in some embodiments of the present disclosure, the voltage differences range from 5 V to 200 V.

The present disclosure further provides another manufacturing method of a display panel. The method includes following steps:
providing a substrate;
disposing a plurality of pixel electrode layers on the substrate;
dividing each of the pixel electrode layers into m rows and n columns of sub-pixel electrode layers, wherein, a gap is between the sub-pixel electrode layers, m and n are positive integers greater than or equal to 1, and m and n are not equal to 1 at a same time;
disposing a pixel definition layer on one side of the pixel electrode layers away from the substrate;

forming a plurality of openings corresponding to the pixel electrode layers on the pixel definition layer, wherein, each of the openings corresponds to each of the pixel electrode layers;

forming electric fields between the sub-pixel electrode layers; and ink-jet printing a plurality of light-emitting functional layers into the openings under the electric fields.

Optionally, in some embodiments of the present disclosure, m is two and n is two.

Optionally, in some embodiments of the present disclosure, the step of forming the electric fields between the sub-pixel electrode layers includes a following step:

electrifying the sub-pixel electrode layers to generate voltage differences between the sub-pixel electrode layers and then forming the electric fields between the sub-pixel electrode layers.

Optionally, in some embodiments of the present disclosure, before the step of electrifying the sub-pixel electrode layers to generate the voltage differences between the sub-pixel electrode layers, the method further includes a following step:

disposing a plurality of thin film transistor devices on the substrate, wherein, the thin film transistor devices are insulated from the electrode layers and electrically connected to the pixel electrode layers;

wherein, each of the thin film transistor devices correspondingly controls a voltage of one row of the sub-pixel electrode layers.

Optionally, in some embodiments of the present disclosure, before the step of electrifying the sub-pixel electrode layers to generate the voltage differences between the sub-pixel electrode layers, the method further includes a following step:

disposing a plurality of thin film transistor devices on the substrate, wherein, the thin film transistor devices are insulated from the electrode layers and electrically connected to the pixel electrode layers;

wherein, each of the thin film transistor devices correspondingly controls a voltage of one column of the sub-pixel electrode layers.

Optionally, in some embodiments of the present disclosure, before the step of electrifying the sub-pixel electrode layers to generate the voltage differences between the sub-pixel electrode layers, the method further includes a following step:

disposing a plurality of thin film transistor devices on the substrate, wherein, the thin film transistor devices are insulated from the electrode layers and electrically connected to the pixel electrode layers;

wherein, each of the thin film transistor devices correspondingly controls a voltage of one of the sub-pixel electrode layers.

Optionally, in some embodiments of the present disclosure, the gap between the sub-pixel electrode layers ranges from 1 μm to 10 μm.

Optionally, in some embodiments of the present disclosure, the voltage differences range from 1 V to 500 V.

Optionally, in some embodiments of the present disclosure, the voltage differences range from 5 V to 200 V. Correspondingly, the present disclosure further provides the display panel manufactured by the manufacturing method mentioned above.

Beneficial effect: the manufacturing method of the display panel provided by the present disclosure generates the electric fields between the pixel electrode layers or between the pixel electrode layers and the electrode layers. In some embodiments, the manufacturing method of the display panel may also divide each of the pixel electrode layers into the sub-pixel electrode layers and generate the electric fields between the sub-pixel electrode layers. The electric fields have a horizontal component and a vertical component. The vertical component of the electric fields provides a force of depositing on the pixel electrode layers for charged groups in a material of the light-emitting functional layers. Therefore, the method can prompt an ink of a light-emitting functional material to be deposited on the pixel electrode layers. The electric fields of the manufacturing method of the display panel provided by the present disclosure are easy to control. The light-emitting functional layers can be deposited under assistance of the electric fields, thereby allowing the light-emitting functional layers to be deposited more uniformly and preventing an occurrence of coffee ring phenomenon. In addition, under the assistance of the electric fields, the method can also prevent nozzles of ink-jet printing equipments from being clogged, thereby reducing costs of the ink-jet printing equipments.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
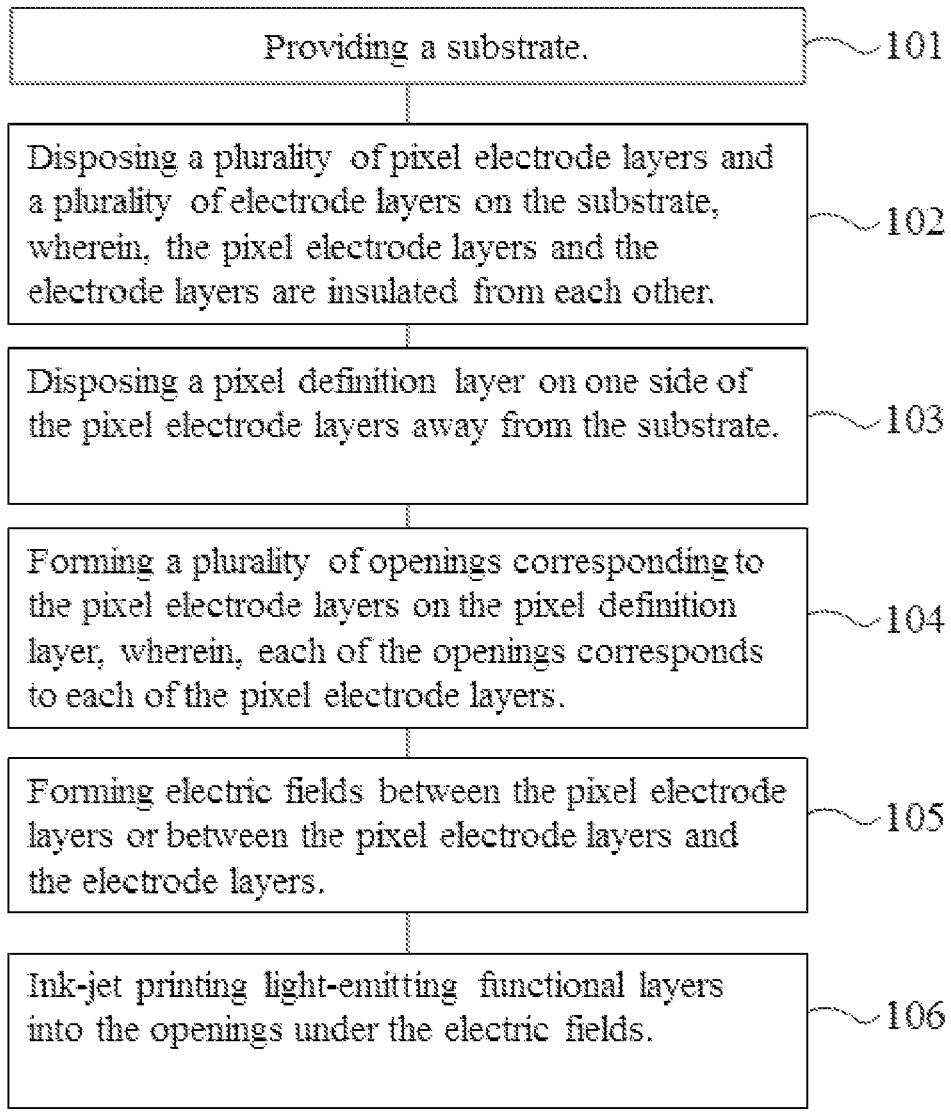
FIG. 1 is a first flowchart of a manufacturing method of a display panel according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

An embodiment of the present disclosure provides a manufacturing method of a display panel and the display panel. They will be described in detail in the following. It should be noted that an order of description in the following embodiments is not meant to limit a preferred order of the embodiments.

Figure 2:
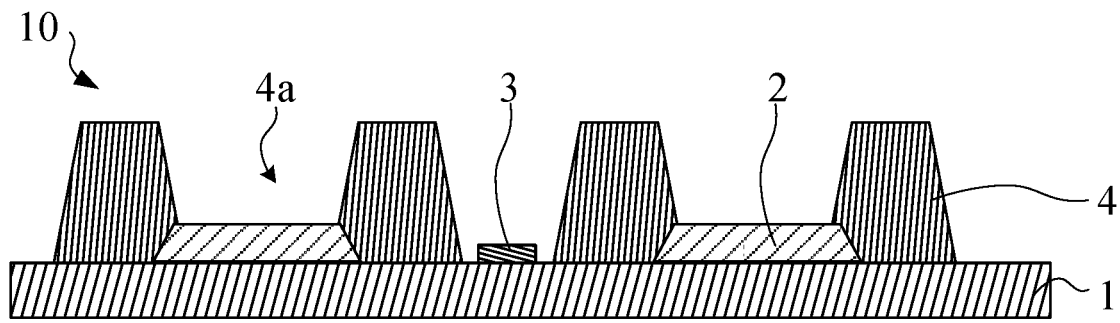
FIG. 2 is a first schematic structural diagram of the display panel according to an embodiment of the present disclosure.

The present disclosure provides the manufacturing method of the display panel. Referring to FIGS. 1 and 2, FIG. 1 is a first flowchart of the manufacturing method of the display panel according to an embodiment of the present disclosure, and FIG. 2 is a first schematic structural diagram of the display panel according to an embodiment of the present disclosure. The manufacturing method of the display panel shown in FIG. 1 specifically includes following steps.

Step 101: providing a substrate 1.

Wherein, the substrate means a base member carrying a touch control electrode structure. In some embodiments, the substrate may be glass, functional glass (such as sensor glass), or flexible substrates.

The functional glass is obtained by sputtering a transparent metal oxide conductive thin film on ultra-thin glass and annealing at a high temperature.

Wherein, a material of the flexible substrates may be a polymer material, specifically may be polyimide (PI), polyethylene (PE), polypropylene (PP), polystyrene (PS), polyethylene terephthalate (PET), or polyethylene naphthalate (PEN). The polymer material has good flexibility, lightweightness, and shock proof, thereby being suitable for flexible display panels. Wherein, polyimide can also achieve excellent heat resistance and stability.

Step 102: disposing a plurality of pixel electrode layers 2 and a plurality of electrode layers 3 on the substrate 1. Wherein, the pixel electrode layers 2 and the electrode layers 3 are insulated from each other.

The pixel electrode layers 2 and the electrode layers 3 being insulated from each other means there are intervals between the pixel electrode layers 2 and the electrode layers 3. In some embodiments, inorganic film layers such as passivation layers, interlayer insulating layers, or buffer layers are disposed between the pixel electrode layers 2 and the electrode layers 3 for insulation. A specific disposition method may be adaptively changed according to a specific display panel 10 and will not be repeated here. It should be noted that disposing the pixel electrode layers 2 and the electrode layers 3 on the substrate 1 means disposing the pixel electrode layers 2 and the electrode layers 3 on a same side of the substrate rather than limiting the pixel electrode layers 2 and the electrode layers 3 to be disposed on a surface of the substrate. In addition, a relative position relationship between the pixel electrode layers 2 and the electrode layers 3 shown in FIG. 2 is only for illustration and is not as a restriction on the present disclosure.

Specifically, the pixel electrode layers 2 may be disposed on the substrate 1 by deposition and may use transparent metal oxides or a lamination of metals and the transparent metal oxides.

A material of the transparent metal oxides includes any one of indium gallium zinc oxide, indium zinc tin oxide, indium gallium zinc tin oxide, indium tin oxide, indium zinc oxide, indium aluminum zinc oxide, indium gallium tin oxide, or antimony tin oxide. The above materials have good conductivity and transparency, and can have a thinner thickness, thereby being unable to affect whole thickness of the display panel. At a same time, the above materials may also reduce electrical radiation, ultraviolet light, and infrared light that are harmful to human bodies.

A material used for a metal layer may be any one of silver, aluminum, nickel, chromium, molybdenum, copper, tungsten, or titanium. The metals have good conductivity and low cost, so production cost can be reduced while ensuring conductivity of anodes.

In an embodiment, the pixel electrode layers 2 are deposited laminates of indium tin oxide/silver/indium tin oxide.

It can be understood that the pixel electrode layers 2 may be the anodes or cathodes of light-emitting devices. In the present disclosure, the pixel electrode layers 2 being the anodes is taken as an example for description.

Step 103: disposing a pixel definition layer 4 on one side of the pixel electrode layers 2 away from the substrate 1.

Optionally, in some embodiments of the present disclosure, one side of the pixel definition layer 4 adjacent to the substrate 1 has lyophilicity, and one side of the pixel definition layer 4 away from the substrate 1 has lyophobicity.

Lyophilicity means that a material surface is easily wetted or dissolved by a liquid medium. Lyophobicity (also called hydrophobicity) is opposite to lyophilicity and means that the material surface is not easily wetted or dissolved by the liquid medium. Lyophilicity and lyophobicity properties of the material surface are mainly determined by a surface structure or properties of functional groups thereof. The present disclosure may change and adjust lyophilicity and lyophobicity properties of the pixel definition layer 4 by adjusting process parameters. For example, the lyophilicity and lyophobicity properties of the pixel definition layer 4 may be changed and adjusted by adjusting developing and curing process parameters. The pixel definition layer 4 set in this way can be adapted to different printing processes, ink types, and film thicknesses, thereby allowing the pixel definition layer 4 to be easier to meet requirements of different display panels.

Specifically, a thickness of the pixel definition layer 4 will affect its lyophilicity and lyophobicity properties. For example, when a lyophobic material is very thin, it will not have lyophobicity. In addition, performing an oxygen ($O_2$) or nitrogen ($N_2$) plasma treatment on a material can allow the material to have lyophilicity, and performing a fluorine gas ($F_2$) plasma treatment on the material can allow the material to have lyophobicity.

Step 104: forming a plurality of openings 4a corresponding to the pixel electrode layers 2 on the pixel definition layer 4, wherein, each of the openings 4a corresponds to each of the pixel electrode layers 2.

The openings 4a may be formed on the pixel definition layer 4 by an etching method, and more specifically, by wet etching or dry etching. Further, the etching method may be chemical etching, electrolytic etching, ion beam sputtering etching, plasma etching, or reactive particle etching. A specific setting method is common technical means in this field and will not be repeated here.

Step 105: forming electric fields between the pixel electrode layers 2 or between the pixel electrode layers 2 and the electrode layers 3.

Figure 3:
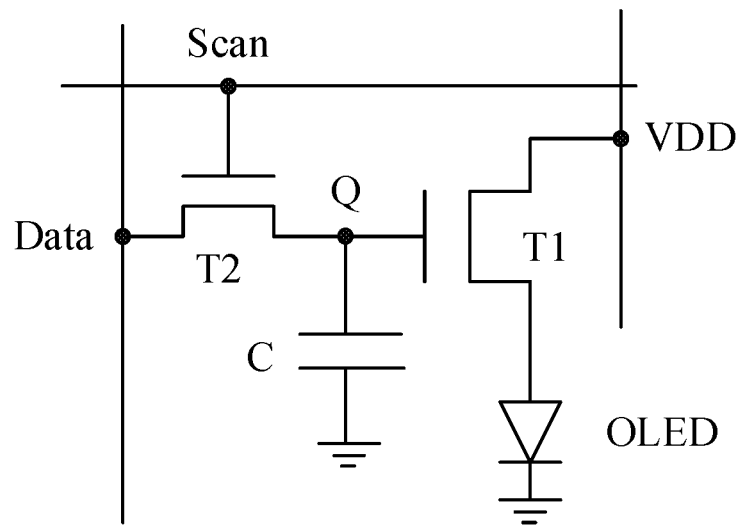
FIG. 3 is a schematic diagram of a pixel circuit formed in the manufacturing method of the display panel according to an embodiment of the present disclosure.
Figure 4:
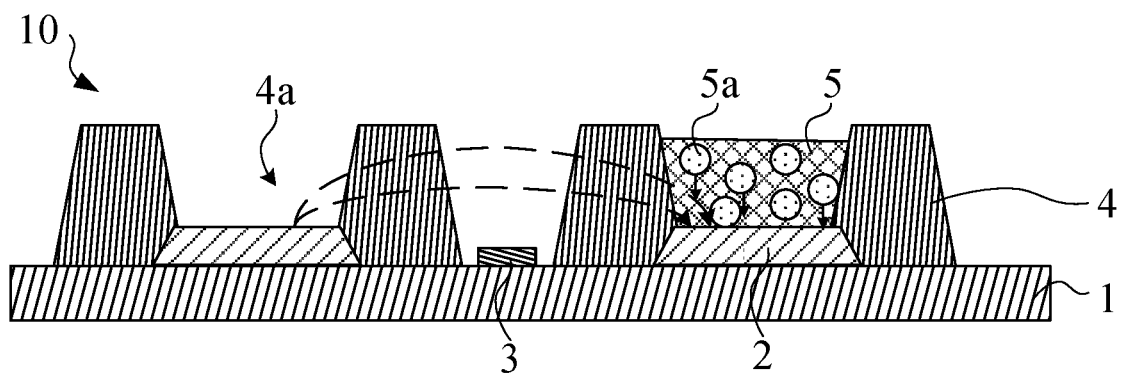
FIG. 4 is a schematic principle diagram of an electric field generated between pixel electrode layers in the manufacturing method of the display panel according to an embodiment of the present disclosure.

Referring to FIGS. 3 and 4, FIG. 3 is a schematic diagram of a pixel circuit formed in the manufacturing method of the display panel according to an embodiment of the present disclosure, and FIG. 4 is a schematic principle diagram of an electric field generated between the pixel electrode layers in the manufacturing method of the display panel according to an embodiment of the present disclosure. Forming the electric fields between the pixel electrode layers 2 specifically includes a following step:

electrifying the pixel electrode layers 2 to generate voltage differences between the pixel electrode layers 2 and then forming the electric fields between the pixel electrode layers 2.

In the display panel 10, pixel circuits are usually manufactured first and then the light-emitting devices are manufactured. The pixel circuit shown in FIG. 3 is taken as an example for description in the following. The pixel circuit includes a drive transistor T1, a switch transistor T2, and a storage capacitor C. An input terminal of the drive transistor T1 is connected to a power supply voltage VDD. An output terminal of the drive transistor T1 is connected to one of the pixel electrode layers 2, that is, an anode of one of the light-emitting devices OLED in FIG. 3. A control terminal of the drive transistor T1 is connected to a first node Q. An input terminal of the switch transistor T2 is connected to a data signal Data. An output terminal of the switch transistor T2 is connected to the first node Q. A control terminal of the switch transistor T2 is connected to a scanning signal Scan. A first terminal of the storage capacitor C is connected to the first node Q, and a second terminal of the storage capacitor C is connected to ground.

The present disclosure can allow two of the pixel electrode layers 2 to have different electrical potentials by outputting different data signals Data to different pixel electrode layers 2. Therefore, a voltage difference between the two of the pixel electrode layers 2 can be generated, thereby forming the electric field between the two of the pixel electrode layers 2. Curved dotted arrows shown in FIG. 3 refer to the electric field.

Figure 5:
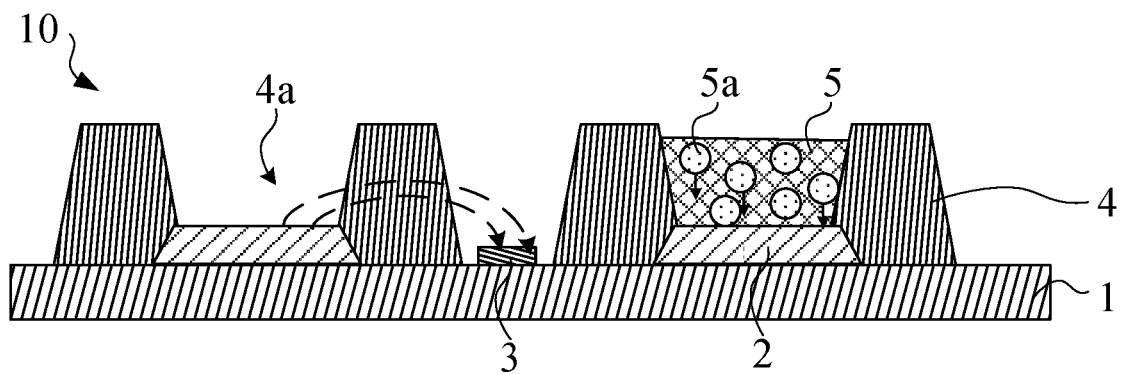
FIG. 5 is a schematic principle diagram of an electric field generated between a pixel electrode layer and an electrode layer in the manufacturing method of the display panel according to an embodiment of the present disclosure.

Referring to FIGS. 3 and 5, FIG. 5 is a schematic principle diagram of an electric field generated between a pixel electrode layer and an electrode layer in the manufacturing method of the display panel according to an embodiment of the present disclosure. Forming the electric fields between the pixel electrode layers 2 and the electrode layers 3 specifically includes a following step:

electrifying the pixel electrode layers 2 and the electrode layers 3 to generate voltage differences between the pixel electrode layers 2 and the electrode layers 3, and then forming the electric fields between the pixel electrode layers 2 and the electrode layers 3.

Specifically, the electrode layers 3 are signal wiring layers or auxiliary cathode layers. The signal wiring layers may be data signal wiring layers configured to output data signals to the pixel circuits. The signal wiring layers may also be any other wirings in the pixel circuits as long as they can generate the voltage differences with the pixel electrode layers 2.

The electrode layer 3 shown in FIG. 5 being a data signal wiring layer is taken as an example and the pixel circuit shown in FIG. 3 is still taken as the example for description in the following. The present disclosure can also allow one of the pixel electrode layers 2 and an adjacent data signal wiring layer to have different electrical potentials by outputting different data signals Data to different pixel electrode layers 2. Therefore, the voltage difference can be generated between the one of the pixel electrode layers 2 and the data signal wiring layer (that is, the electrode layer 3 shown in the figure), thereby forming the electric field between the one of the pixel electrode layers 2 and the electrode layer 3. Curved dotted arrows shown in FIG. 3 refer to the electric field.

Figure 6:
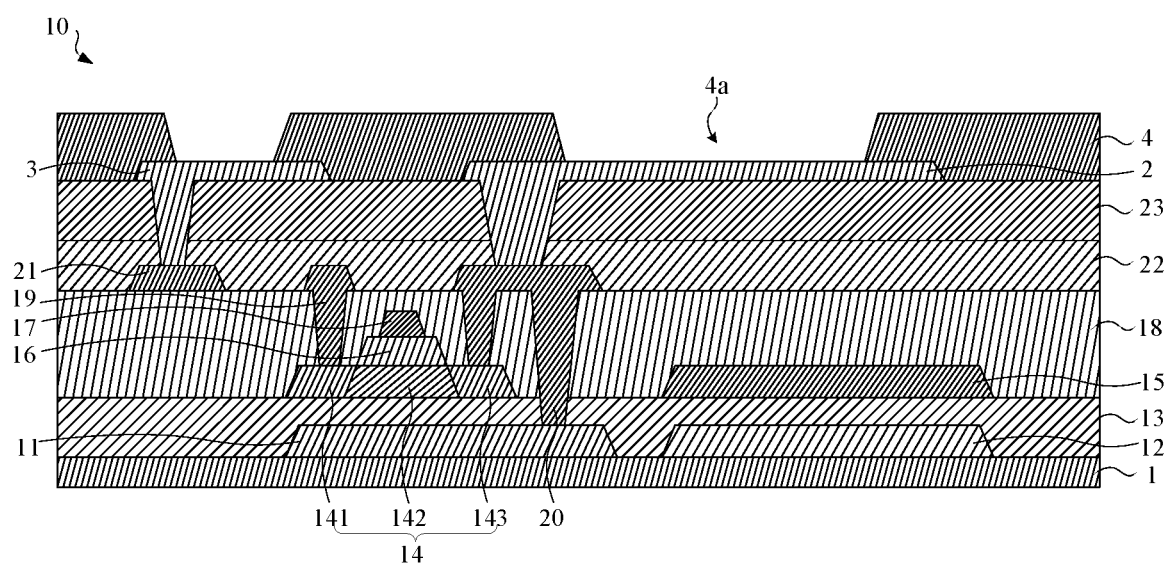
FIG. 6 is a second schematic structural diagram of the display panel according to an embodiment of the present disclosure.

Referring to FIG. 6, FIG. 6 is a second schematic structural diagram of the display panel according to an embodiment of the present disclosure. In some embodiments, the electrode layers 3 are the auxiliary cathode layers. The display panel 10 shown in FIG. 6 includes the substrate 1, a light-shielding layer 11, a first capacitor plate 12, a buffer layer 13, a semiconductor layer 14, a second capacitor plate 15, a gate insulating layer 16, a gate electrode layer 17, an interlayer insulating layer 18, a drain electrode line 19, a source electrode line 20, an auxiliary cathode line 21, a passivation layer 22, a planarization layer 23, the pixel electrode layer 2, the electrode layer 3 (that is, an auxiliary cathode layer shown in FIG. 6), and the pixel definition layer 4 stacked in sequence. Wherein, the semiconductor layer 14 includes a drain electrode area 141, an active area 142, and a source electrode area 143.

A thin film transistor in FIG. 6 being a top gate structure is taken as an example for description. It can be understood that a structure of the thin film transistor included in the display panel 10 of the present disclosure is not limited, it can be a top gate type thin film transistor, a bottom gate type thin film transistor, a double gate type thin film transistor, or a single gate type thin film transistor. A specific structure of the thin film transistor will not be repeated in the present disclosure.

In the display panel 10 shown in FIG. 6, an electrical potential of the auxiliary cathode layer (that is, the electrode layer 3) is controlled by the auxiliary cathode line 21. Therefore, the voltage difference can be generated between the auxiliary cathode layer and the pixel electrode layer 2, thereby forming the electric field between the pixel electrode layer 2 and the electrode layer 3.

The auxiliary cathode layer and the pixel electrode layer 2 are in a same sub-pixel, and a spacing between the auxiliary cathode layer and the pixel electrode layer 2 is very small. Using the auxiliary cathode layer being the electrode layer 3 to generate the electric field with the pixel electrode layer 2 can increase an intensity of the electric field, thereby obtaining a larger assistant effect by the electric field during ink-jet printing.

In some embodiments, each of the pixel electrode layers 2 may be divided into m rows and n columns of sub-pixel electrode layers 2a, and a gap 2b is between two of the sub-pixel electrode layers 2a. Wherein, m and n are positive integers greater than or equal to 1, and m and n are not equal to 1 at a same time.

This setting method can allow sub-pixels to have high and low electrical potentials. The high and low electrical potentials between the rows and columns allow the voltage differences to be generated between the sub-pixel electrode layers 2a, thereby forming the electric fields. An intensity of the electric fields between the sub-pixel electrode layers 2a is larger and can provide sufficient electric field force to assist a printing processing of light-emitting functional layers 5. In addition, this method requires less thin film transistor devices 6, thereby reducing difficulty and accuracy of manufacturing processes.

Step 106: ink-jet printing the light-emitting functional layers 5 into the openings under the electric fields.

Each of the light-emitting functional layers may include a hole injection layer, a hole transport layer, a light-emitting layer, an electron transport layer, and an electron injection layer stacked in a direction away from the substrate. Technical features of the hole injection layer, the hole transport layer, the light-emitting layer, the electron transport layer, and the electron injection layer are well-known by a skilled person in the art and will not be repeated here. In some embodiments, each of the light-emitting functional layers may also include a hole blocking layer and an electron blocking layer.

Specifically, the hole injection layer, the hole transport layer, the light-emitting layer, the electron transport layer, and the electron injection layer are formed in sequence on a first surface by ink-jet printing. After ink-jet printing organic light-emitting materials, planarizing, drying, and baking the organic light-emitting materials to obtain the light-emitting functional layers. Film forming areas can be accurately controlled by ink-jet printing, thereby saving materials, reducing costs, and improving product yields.

In the present disclosure, the light-emitting functional layers 5 are formed by ink-jet printing under an effect of the electric fields. Referring to FIG. 4, the electric field formed between the pixel electrode layers 2 has a horizontal component and a vertical component. The vertical component of the electric field provides a force of depositing on the pixel electrode layers 2 for charged groups 5a in a material of the light-emitting functional layers 5. Therefore, the method can prompt an ink of a light-emitting functional material to be deposited on the pixel electrode layers 2.

It should be noted that the hole injection layer, the hole transport layer, the light-emitting layer, the electron transport layer, and the electron injection layer mentioned above all can be formed by ink-jet printing under the electric field. During an ink-jet printing process, adjusting the voltage differences between the pixel electrode layers 2 or the voltage differences between the pixel electrode layers 2 and the electrode layers 3 can adapt to printing requirements of different film layers.

In the ink-jet printing process of the light-emitting functional layers 5, the electric fields between the pixel electrode layers 2 or between the pixel electrode layers 2 and the electrode layers 3 may be chosen to assist printing. Of course, when one of the light-emitting functional layers 5 in one of the sub-pixels is to be printed and other light-emitting functional layers 5 in its surrounding sub-pixels are all already printed, the electric field between the pixel electrode layers 2 and the electrode layers 3 may be chosen for ink-jet printing. In this way, it can prevent a film thickness of the light-emitting functional layers 5 formed in its surrounding sub-pixels from forming an electric shield and affecting the effect of the electric field force. Therefore, the one of the light-emitting functional layers 5 in the one of the sub-pixels can have a better printing effect, and the ink can be deposited more uniformly.

The manufacturing method of the display panel provided by the present disclosure generates the electric fields between the pixel electrode layers or between the pixel electrode layers and the electrode layers. The electric fields have the horizontal component and the vertical component. The vertical component of the electric fields provides the force of depositing on the pixel electrode layers for the charged groups in the material of the light-emitting functional layers. Therefore, the method can prompt the ink of the light-emitting functional material to be deposited on the pixel electrode layers. The present disclosure improves ink-jet printing by the electric field force generated by a horizontal electric field. Adjustment of the horizontal electric field has better process convenience and feasibility than a vertical electric field. In addition, it is difficult to effectively control a distance between an upper electrode and a lower electrode of the vertical electric field.

Figure 7:
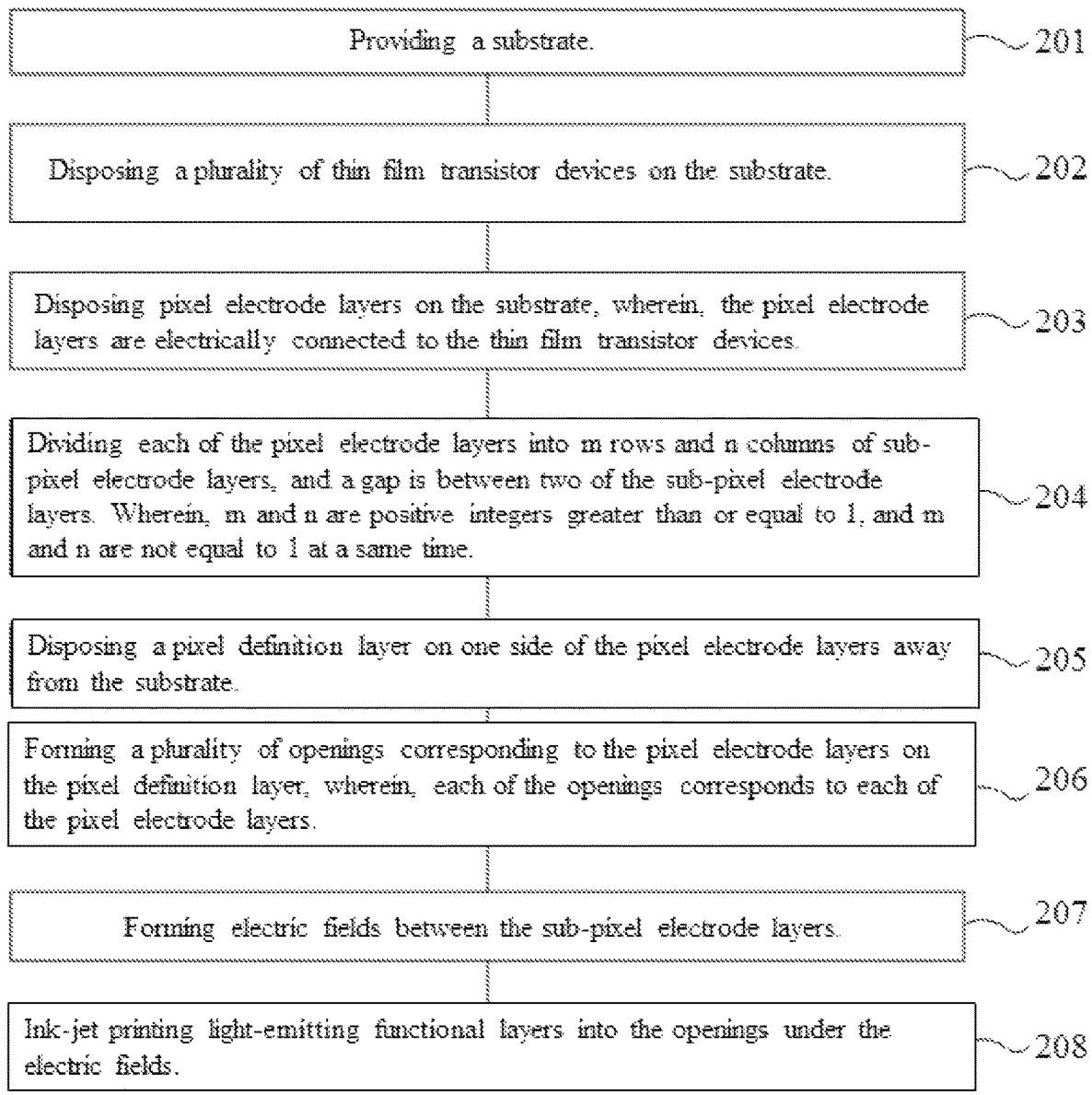
FIG. 7 is a second flowchart of the manufacturing method of the display panel according to an embodiment of the present disclosure.
Figure 8:
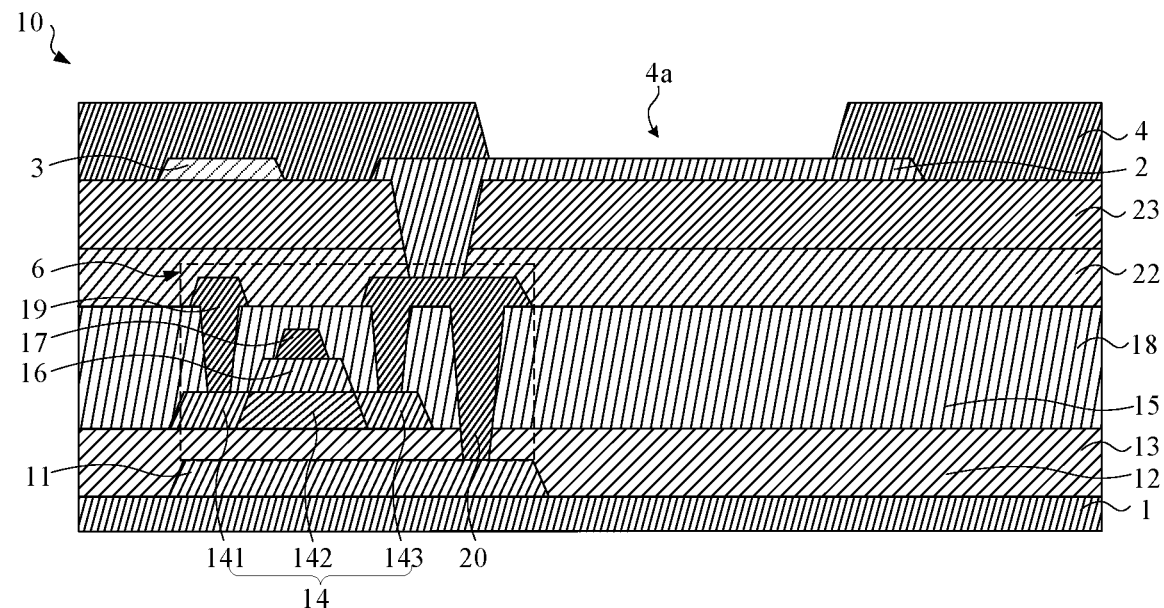
FIG. 8 is a schematic structural top view of the display panel according to an embodiment of the present disclosure.
Figure 9:
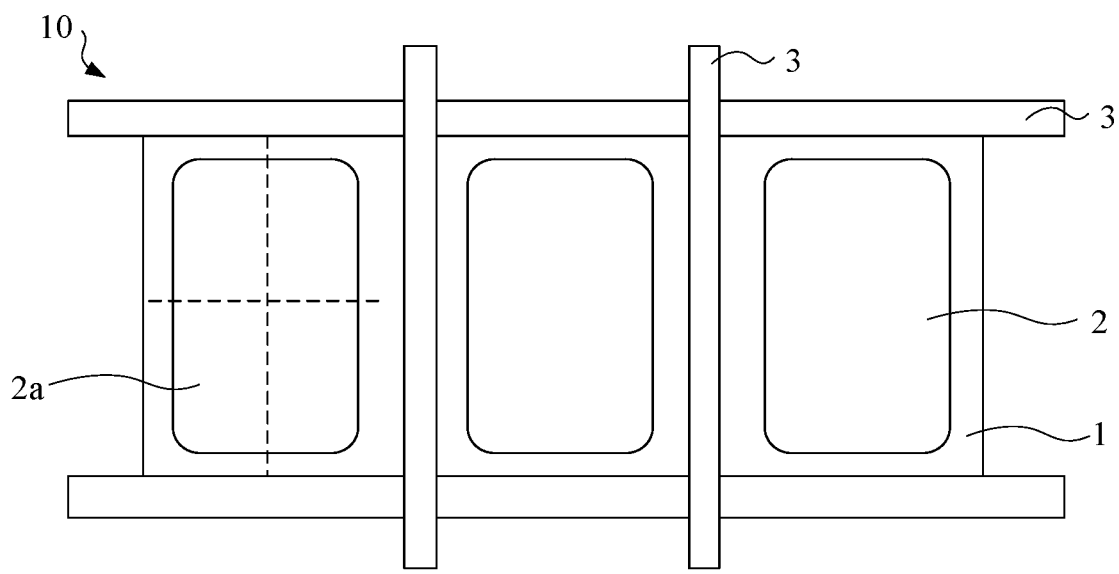
FIG. 9 is a partial schematic structural diagram of sub-pixels in the display panel according to an embodiment of the present disclosure.

Referring to FIGS. 7 to 9, FIG. 7 is a second flowchart of the manufacturing method of the display panel according to an embodiment of the present disclosure. FIG. 8 is a schematic structural top view of the display panel according to an embodiment of the present disclosure. FIG. 9 is a partial schematic structural diagram of the sub-pixels in the display panel according to an embodiment of the present disclosure. The manufacturing method of the display panel shown in FIG. 7 specifically includes following steps.

Step 201: providing the substrate 1.

Step 202: disposing the thin film transistor devices 6 on the substrate 1.

Step 203: disposing the pixel electrode layers 2 on the substrate 1, wherein, the pixel electrode layers 2 are electrically connected to the thin film transistor devices 6.

Step 204: dividing each of the pixel electrode layers 2 into m rows and n columns of sub-pixel electrode layers 2a, and the gap 2b is between the two of the sub-pixel electrode layers 2a. Wherein, m and n are positive integers greater than or equal to 1, and m and n are not equal to 1 at the same time.

It should be noted that the pixel electrode layers 2 are divided properly, and a proportion of divided areas in entire sub-pixel area is controllable. Therefore, dividing each of the pixel electrode layers 2 into m rows and n columns of sub-pixel electrode layers 2a will not affect a light-emitting effect.

Specifically, the pixel electrode layers 2 may be divided by etching. Laser cutting can also be used when the process is allowed. Optionally, after dividing the pixel electrode layers 2, the gap may be filled by a photoresist or a passivation layer material and may also be filled by an upper deposition film when depositing as a whole surface.

Wherein, the gap between the two of the sub-pixel electrode layers 2a ranges from 1 μm to 10 μm. Specifically, the gap between the two of the sub-pixel electrode layers 2a may be 1 μm, 2 μm, 3 μm, 5 μm, 7 μm, 8 μm, 9 μm, or 10 μm. Defining the gap between the sub-pixel electrode layers 2a to range from 1 μm to 10 μm can meet accuracy requirements of processes and realize the light-emitting effect at a same time.

In FIG. 9, m=2 and n=2 is taken as an example, and each of the pixel electrode layers 2 is divided into 2×2 four sub-pixel electrode layers 2a.

Step 205: disposing the pixel definition layer 4 on the side of the pixel electrode layers 2 away from the substrate 1.

Step 206: forming the plurality of openings 4a corresponding to the pixel electrode layers 2 on the pixel definition layer 4, wherein, each of the openings 4a corresponds to each of the pixel electrode layers 2.

Step 207: forming the electric fields between the sub-pixel electrode layers 2a.

Wherein, the voltage differences are generated between the sub-pixel electrode layers 2a, and then the electric fields are formed between the sub-pixel electrode layers 2a.

Figure 10:
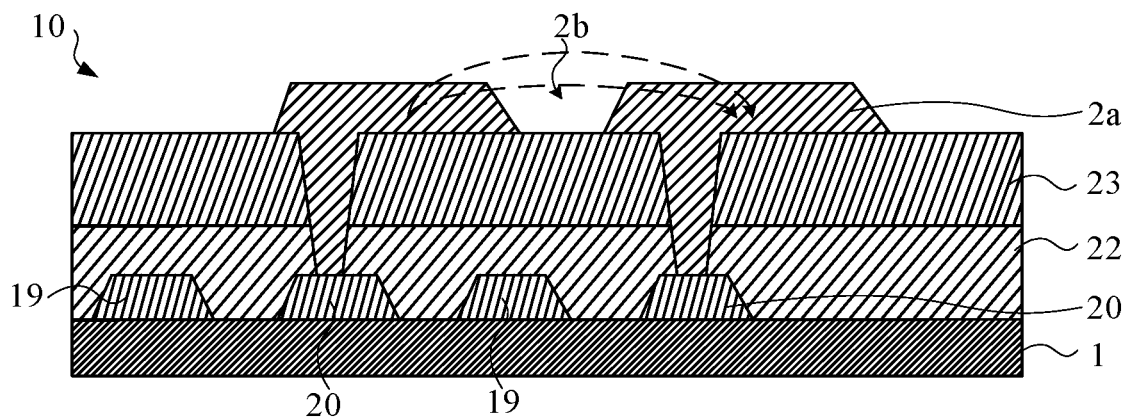
FIG. 10 is a schematic principle diagram of an electric field generated between sub-pixel electrode layers in the manufacturing method of the display panel according to an embodiment of the present disclosure.

Referring to FIG. 10, FIG. 10 is a schematic principle diagram of the electric field generated between the two of the sub-pixel electrode layers in the manufacturing method of the display panel according to an embodiment of the present disclosure. Each of the thin film transistor devices 6 correspondingly controls a voltage of one row of the sub-pixel electrode layers 2a, or each of the thin film transistor devices 6 correspondingly controls a voltage of one column of the sub-pixel electrode layers 2a, or each of the thin film transistor devices 6 correspondingly controls a voltage of one of the sub-pixel electrode layers 2a. Therefore, the voltage differences can be generated between the sub-pixel electrode layers 2a.

Each of the thin film transistor devices 6 correspondingly controlling the voltage of one row or one column of the sub-pixel electrode layers 2a can allow the sub-pixels to have the high and low electrical potentials. The high and low electrical potentials between the rows and columns allow the voltage differences to be generated between the sub-pixel electrode layers 2a, thereby forming the electric fields. The intensity of the electric fields between the sub-pixel electrode layers 2a is larger and can provide sufficient electric field force to assist the printing processing of the light-emitting functional layers 5. In addition, this method requires less thin film transistor devices 6, thereby reducing difficulty and accuracy of manufacturing processes.

Each of the thin film transistor devices 6 correspondingly controlling the voltage of one of the sub-pixel electrode layers 2a can allow the voltage differences to be generated between the sub-pixel electrode layers 2a. This setting method can finely adjust the voltage differences and the electric fields in the sub-pixels.

Step 208: ink-jet printing the light-emitting functional layers 5 into the openings under the electric fields.

Wherein, the voltage differences range from 1 V to 500 V. Further, the voltage differences range from 5 V to 200 V. The voltage differences may be 1 V, 5V, 10 V, 15 V, 20 V, 25 V, 50 V, 100 V, 150 V, 200 V, 300 V, 400 V, 450 V, or 500 V. It is difficult for the thin film transistor devices 6 to withstand an overly large voltage difference, so the overly large voltage difference will affect operations of the thin film transistor devices 6, thereby causing the thin film transistor devices 6 to be difficult to drive. In addition, the overly large voltage difference may cause electrostatic discharge (ESD). An overly small voltage difference may cause a weaker electric field, which cannot provide sufficient electric field force, thereby causing uneven deposition and unsatisfactory film thickness.

The manufacturing method of the display panel in this embodiment divides each of the pixel electrode layers into the plurality of sub-pixel electrode layers. A spacing between the sub-pixel electrode layers is smaller, thereby generating a stronger electric field force. The vertical component of the electric fields generated by this electric field force can further improve an electrical deposition effect, shorten deposition time, and improve film formation quality.

The present disclosure also provides the display panel. The display panel is manufactured by the manufacturing method of the display panel mentioned above.

The display panel of the present disclosure can be applied to electronic devices. The electronic devices may be at least one of smartphones, tablet personal computers, mobile phones, video phones, e-book readers, desktop PCs, laptop PCs, netbook computers, workstations, servers, personal digital assistants, portable multimedia players, MP3 players, mobile medical devices, cameras, game consoles, digital cameras, car navigation systems, electronic billboards, ATMs, or wearable devices.

The display panel of the present disclosure is manufactured by the manufacturing method of the display panel mentioned above. The manufacturing method of the display panel provided by the present disclosure generates the electric fields between the pixel electrode layers or between the pixel electrode layers and the electrode layers. In some embodiments, the manufacturing method of the display panel provided by the present disclosure may also divide each of the pixel electrode layers into the sub-pixel electrode layers, thereby forming the electric fields between the sub-pixel electrode layers. The electric fields have the horizontal component and the vertical component. The vertical component of the electric fields provides the force of depositing on the pixel electrode layers for the charged groups in the material of the light-emitting functional layers. Therefore, the method can prompt the ink of the light-emitting functional material to be deposited on the pixel electrode layers. The electric fields of the manufacturing method of the display panel provided by the present disclosure are easy to control. The light-emitting functional layers can be deposited under assistance of the electric fields, thereby allowing the light-emitting functional layers to be deposited more uniformly and preventing an occurrence of coffee ring phenomenon. In addition, under the assistance of the electric fields, the method can also prevent nozzles of ink-jet printing equipments from being clogged, thereby reducing costs of the ink-jet printing equipments.

The manufacturing method of the display panel and the display panel provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A manufacturing method of a display panel, comprising following steps:

providing a substrate;

disposing a plurality of pixel electrode layers and a plurality of electrode layers on the substrate, wherein the pixel electrode layers and the electrode layers are insulated from each other;

disposing a pixel definition layer on one side of the pixel electrode layers away from the substrate;

forming a plurality of openings corresponding to the pixel electrode layers on the pixel definition layer, wherein each of the openings corresponds to each of the pixel electrode layers;

forming electric fields between the pixel electrode layers or between the pixel electrode layers and the electrode layers, wherein the forming of the electric fields between the pixel electrode layers comprises: electrifying the pixel electrode layers to generate voltage differences between the pixel electrode layers and then forming the electric fields between the pixel electrode layers, wherein the forming of the electric fields between the pixel electrode layers and the electrode layers comprises: electrifying the pixel electrode layers and the electrode layers to generate voltage differences between the pixel electrode layers and the electrode layers, and then forming the electric fields between the pixel electrode layers and the electrode layers; and ink-jet printing a plurality of light-emitting functional layers into the openings under the electric fields.

2. The manufacturing method of the display panel according to claim 1, wherein after the step of disposing the pixel electrode layers and the electrode layers on the substrate, the method further comprises following steps:
- dividing each of the pixel electrode layers into m rows and n columns of sub-pixel electrode layers, wherein a gap is between the sub-pixel electrode layers, m and n are positive integers greater than or equal to 1, and m and n are not equal to 1 at a same time; and
- generating voltage differences between the sub-pixel electrode layers and then forming the electric fields between the sub-pixel electrode layers.

3. The manufacturing method of the display panel according to claim 2, wherein m is two and n is two.

4. The manufacturing method of the display panel according to claim 2, wherein before the step of generating the voltage differences between the sub-pixel electrode layers, the method further comprises a following step:
- disposing a plurality of thin film transistor devices on the substrate, wherein the thin film transistor devices are insulated from the electrode layers and electrically connected to the pixel electrode layers;
- wherein each of the thin film transistor devices correspondingly controls a voltage of one row of the sub-pixel electrode layers, one column of the sub-pixel electrode layers, or one of the sub-pixel electrode layers.

5. The manufacturing method of the display panel according to claim 2, wherein the gap between the sub-pixel electrode layers ranges from 1 μm to 10 μm.

6. The manufacturing method of the display panel according to claim 1, wherein the electrode layers are signal wiring layers or auxiliary cathode layers.

7. The manufacturing method of the display panel according to claim 1, wherein the voltage differences range from 1 V to 500 V.

8. The manufacturing method of the display panel according to claim 7, wherein the voltage differences range from 5 V to 200 V.

9. A manufacturing method of a display panel, comprising following steps:
- providing a substrate;
- disposing a plurality of pixel electrode layers and a plurality of electrode layers on the substrate, wherein the pixel electrode layers and the electrode layers are insulated from each other;
- dividing each of the pixel electrode layers into m rows and n columns of sub-pixel electrode layers, wherein a gap is between the sub-pixel electrode layers, m and n are positive integers greater than or equal to 1, and m and n are not equal to 1 at a same time;
- disposing a pixel definition layer on one side of the pixel electrode layers away from the substrate;
- forming a plurality of openings corresponding to the pixel electrode layers on the pixel definition layer, wherein each of the openings corresponds to each of the pixel electrode layers;
- forming first electric fields between the pixel electrode layers or between the pixel electrode layers and the electrode layers,
  - wherein the forming of the first electric fields between the pixel electrode layers comprises: electrifying the pixel electrode layers to generate voltage differences between the pixel electrode layers and then forming the first electric fields between the pixel electrode layers,
  - wherein the forming of the first electric fields between the pixel electrode layers and the electrode layers comprises: electrifying the pixel electrode layers and the electrode layers to generate voltage differences between the pixel electrode layers and the electrode layers, and then forming the first electric fields between the pixel electrode layers and the electrode layers;
- forming second electric fields between the sub-pixel electrode layers; and
- ink-jet printing a plurality of light-emitting functional layers into the openings under the first and the second electric fields.

10. The manufacturing method of the display panel according to claim 9, wherein m is two and n is two.

11. The manufacturing method of the display panel according to claim 9, wherein the step of forming the second electric fields between the sub-pixel electrode layers comprises a following step:
- electrifying the sub-pixel electrode layers to generate voltage differences between the sub-pixel electrode layers and then forming the second electric fields between the sub-pixel electrode layers.

12. The manufacturing method of the display panel according to claim 11, wherein before the step of electrifying the sub-pixel electrode layers to generate the voltage differences between the sub-pixel electrode layers, the method further comprises a following step:
- disposing a plurality of thin film transistor devices on the substrate, wherein the thin film transistor devices are electrically connected to the pixel electrode layers;
- wherein each of the thin film transistor devices correspondingly controls a voltage of one row of the sub-pixel electrode layers.

13. The manufacturing method of the display panel according to claim 11, wherein before the step of electrifying the sub-pixel electrode layers to generate the voltage differences between the sub-pixel electrode layers, the method further comprises a following step:
- disposing a plurality of thin film transistor devices on the substrate, wherein the thin film transistor devices are electrically connected to the pixel electrode layers;
- wherein each of the thin film transistor devices correspondingly controls a voltage of one column of the sub-pixel electrode layers.

14. The manufacturing method of the display panel according to claim 11, wherein before the step of electrifying the sub-pixel electrode layers to generate the voltage differences between the sub-pixel electrode layers, the method further comprises a following step:
- disposing a plurality of thin film transistor devices on the substrate, wherein the thin film transistor devices are electrically connected to the pixel electrode layers;
- wherein each of the thin film transistor devices correspondingly controls a voltage of one of the sub-pixel electrode layers.

15. The manufacturing method of the display panel according to claim 9, wherein the gap between the sub-pixel electrode layers ranges from 1 μm to 10 μm.

16. The manufacturing method of the display panel according to claim 11, wherein the voltage differences range from 1 V to 500 V.

17. The manufacturing method of the display panel according to claim 16, wherein the voltage differences range from 5 V to 200 V.

18. A display panel, being manufactured by a manufacturing method of the display panel, wherein the method comprises:
- providing a substrate;
- disposing a plurality of pixel electrode layers and a plurality of electrode layers on the substrate, wherein the pixel electrode layers and the electrode layers are insulated from each other;
- disposing a pixel definition layer on one side of the pixel electrode layers away from the substrate;
- forming a plurality of openings corresponding to the pixel electrode layers on the pixel definition layer, wherein each of the openings corresponds to each of the pixel electrode layers;
- forming electric fields between the pixel electrode layers or between the pixel electrode layers and the electrode layers,
  - wherein the forming of the electric fields between the pixel electrode layers comprises: electrifying the pixel electrode layers to generate voltage differences between the pixel electrode layers and then forming the electric fields between the pixel electrode layers,
  - wherein the forming of the electric fields between the pixel electrode layers and the electrode layers comprises: electrifying the pixel electrode layers and the electrode layers to generate voltage differences between the pixel electrode layers and the electrode layers, and then forming the electric fields between the pixel electrode layers and the electrode layers; and
- ink-jet printing a plurality of light-emitting functional layers into the openings under the electric fields.

* * * * *